US012085764B2

(12) United States Patent
Lee et al.

(10) Patent No.: US 12,085,764 B2
(45) Date of Patent: Sep. 10, 2024

(54) CONNECTION SYSTEM FOR PRINTED CIRCUIT BOARD

(71) Applicant: Senko Advanced Components, Inc., Marlborough, MA (US)

(72) Inventors: Benjamin Lee, Wayland, MA (US); Takuya Ninomiya, Saitama (JP)

(73) Assignee: Senko Advanced Components, Inc., Hudson, MA (US)

( * ) Notice: Subject to any disclaimer, the term of this patent is extended or adjusted under 35 U.S.C. 154(b) by 107 days.

(21) Appl. No.: 17/742,498

(22) Filed: May 12, 2022

(65) Prior Publication Data

US 2022/0365288 A1    Nov. 17, 2022

Related U.S. Application Data

(60) Provisional application No. 63/187,718, filed on May 12, 2021.

(51) Int. Cl.
| | |
|---|---|
| *G02B 6/38* | (2006.01) |
| *G02F 1/1335* | (2006.01) |
| *G02F 1/13357* | (2006.01) |
| *H01R 13/46* | (2006.01) |
| *H01R 13/631* | (2006.01) |
| *H01R 12/71* | (2011.01) |

(Continued)

(52) U.S. Cl.
CPC ......... *G02B 6/3817* (2013.01); *G02B 6/3851* (2013.01); *G02B 6/3897* (2013.01); *G02F 1/133603* (2013.01); *G02F 1/133607* (2021.01); *H01R 13/46* (2013.01); *H01R 13/631* (2013.01); *H01R 12/716* (2013.01); *H01R 24/60* (2013.01); *H05K 1/181* (2013.01); *H05K 2201/10189* (2013.01); *H05K 2201/10454* (2013.01); *H05K 2201/10462* (2013.01)

(58) Field of Classification Search
CPC ... G02B 6/3817; G02B 6/3851; G02B 6/3897
See application file for complete search history.

(56) References Cited

U.S. PATENT DOCUMENTS

| | | | | |
|---|---|---|---|---|
| 5,424,573 A | * | 6/1995 | Kato | ................... H01L 31/0203 |
| | | | | 257/116 |
| 6,076,975 A | * | 6/2000 | Roth | .................... G02B 6/3825 |
| | | | | 385/60 |

(Continued)

FOREIGN PATENT DOCUMENTS

WO    WO-2017102517 A1 *    6/2017

*Primary Examiner* — Charlie Y Peng

(57) ABSTRACT

A connection system for a printed circuit board employs either an inline or transverse board-mounted connector for holding board-mounted optical fibers. A plug-in connector can blind mate with the board-mounted connector. The plug-in connector has a plug-in connector body, a plug-in ferrule, and a plug-in ferrule holder. The plug-in holder latches with the plug-in connector body at either of two positions to selectively configure the plug-in connector for blind mating with either the inline or transverse board-mounted connector. The board-mounted fibers can be supported by a board-mounted ferrule assembly including a ferrule and a ferrule holder that is configured to selectively attach the board-mounted ferrule assembly to either of an inline board-mounted connector body and a transverse board-mounted connector body.

18 Claims, 17 Drawing Sheets

(51) Int. Cl.
*H01R 24/60* (2011.01)
*H05K 1/18* (2006.01)

(56) References Cited

U.S. PATENT DOCUMENTS

| | | | | |
|---|---|---|---|---|
| 6,331,079 B1 * | 12/2001 | Grois | ................... | G02B 6/3897 |
| | | | | 385/60 |
| 6,419,399 B1 * | 7/2002 | Loder | ................ | G02B 6/38875 |
| | | | | 385/53 |
| 2011/0274437 A1 * | 11/2011 | Jones | ................... | G02B 6/3879 |
| | | | | 398/141 |
| 2012/0141070 A1 * | 6/2012 | Sabo | ................... | G02B 6/3881 |
| | | | | 385/60 |
| 2015/0338583 A1 * | 11/2015 | Valencia | .............. | G02B 6/3883 |
| | | | | 385/59 |
| 2017/0227720 A1 * | 8/2017 | Lin | ...................... | G02B 6/3885 |

\* cited by examiner

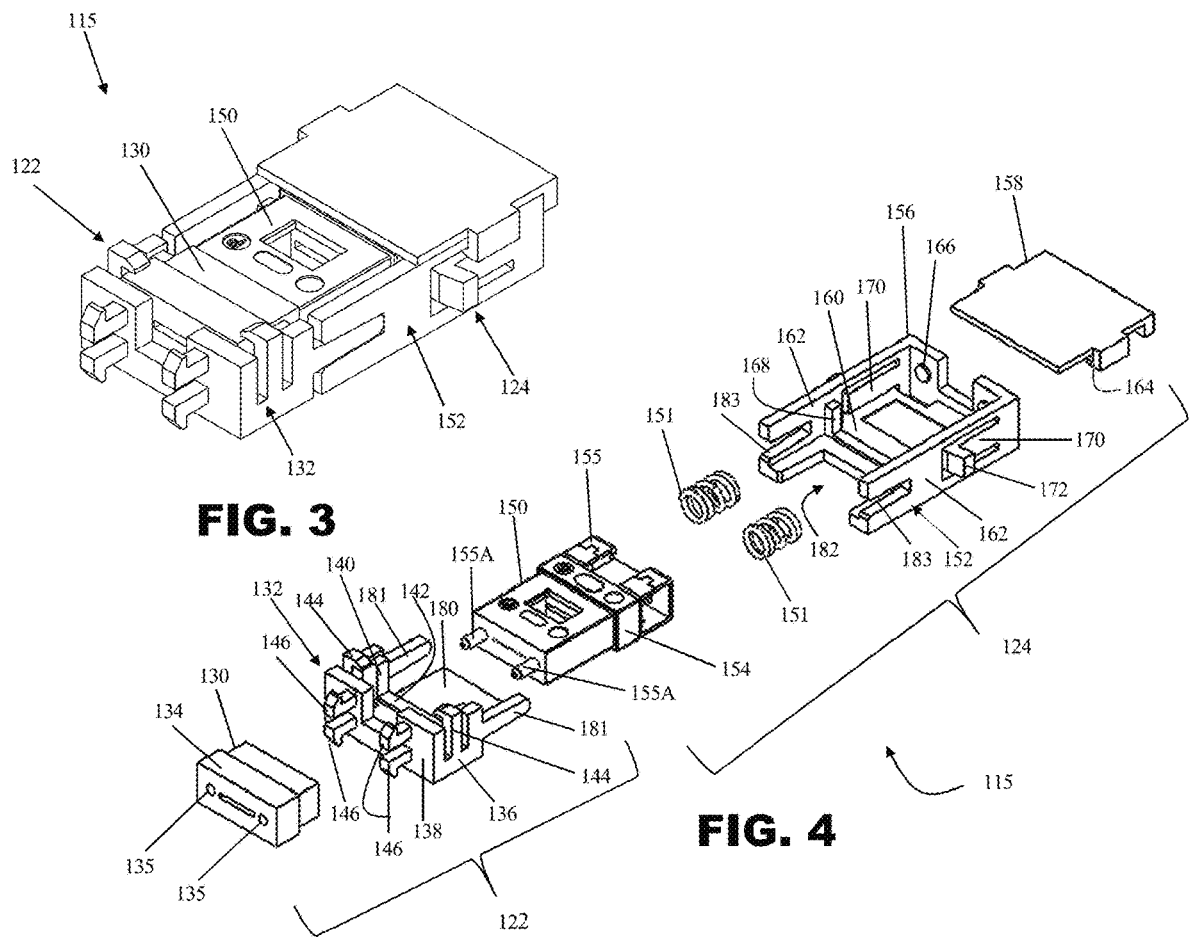

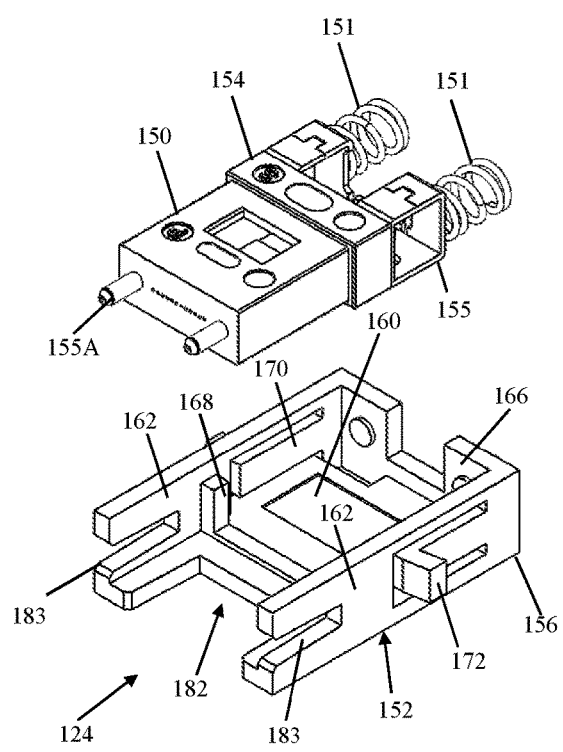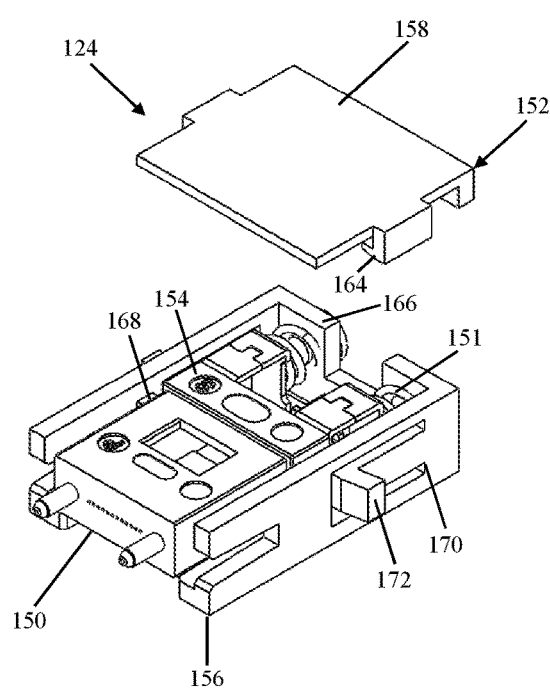
FIG. 13          FIG. 14

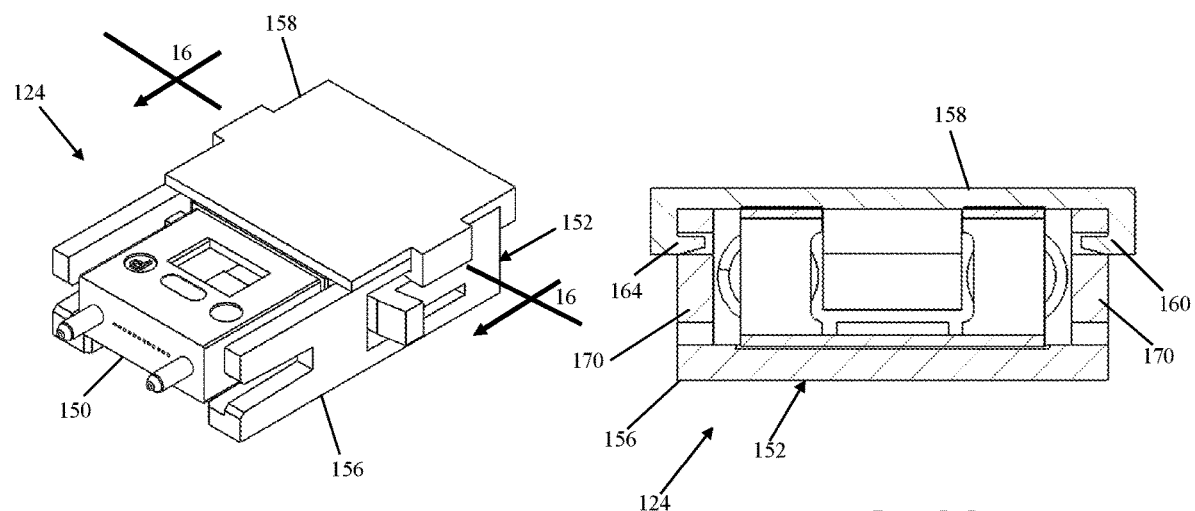

CONNECTION SYSTEM FOR PRINTED CIRCUIT BOARD

CROSS-REFERENCE TO RELATED APPLICATION

This application claims priority to U.S. Provisional Patent Application No. 63/187,718, filed May 12, 2021, which is hereby incorporated by reference in its entirety.

FIELD

This disclosure generally pertains to a connection system including an optical connection subassembly and connectors and ferrule subassemblies that can be used in such a connection system.

BACKGROUND

The prevalence of the Internet has led to unprecedented growth in communication networks. Consumer demand for service and increased competition has driven network providers to continuously search for ways to improve quality of service while reducing cost. For example, there is a need for passive interconnect systems that make optical connections to a printed circuit board. There is an increasing demand for a connection system which incorporates fiber optic interconnect to existing electric connector system without increasing the original footprint. To meet this demand, the MT (mechanical transfer) ferrule is used to save space and establish optical connection at the same time when the electric connection is established.

SUMMARY

In one aspect, a connection system for a printed circuit board comprises a board-mounted connector comprising a board-mounted connector body configured to mount on the printed circuit board and to hold a plurality of board-mounted optical fibers. The board-mounted optical fibers are operatively connected to the printed circuit board. A plug-in connector is configured to blind mate with the board-mounted connector. The plug-in connector comprises a plug-in connector body. The plug-in connector further comprises a plug-in ferrule assembly. The plug-in ferrule assembly comprises a plug-in ferrule and a plug-in ferrule holder holding the plug-in ferrule. The plug-in ferrule holder comprises a latch element for latching with the plug-in connector body to retain the plug-in ferrule assembly on the plug-in connector body such that the system makes an optical connection between the plug-in ferrule and the plurality of board-mounted optical fibers when the plug-in connector is blind-mated with the board-mounted connector.

In another aspect, a board-mounted ferrule assembly comprises a ferrule terminating a plurality of board-mounted optical fibers. The ferrule comprises a ferrule flange. A ferrule holder comprises a rear wall and a forward stop. The ferrule holder is configured for holding the ferrule such that the ferrule flange is received between the rear wall and the forward stop. The ferrule holder further comprises a plurality of latch arms extending from the rear wall. The plurality of latch arms is configured to selectively attach the board-mounted ferrule assembly to either of (i) an inline board-mounted connector body and (ii) a transverse board-mounted connector body such that the respective one of the board-mounted connector bodies holds the ferrule for making an optical connection to another ferrule supported on a plug-in connector body of a plug-in connector when the plug-in connector body is blind mated to the respective board-mounted connector bodies.

In another aspect, a plug-in connector for making a plug-in connection to a printed circuit board comprises a plug-in connector body comprising least one first latching element. A plug-in ferrule assembly comprises a plug-in ferrule and a plug-in ferrule holder for holding the plug-in ferrule. The plug-in ferrule holder comprises at least one second latching element. The at least one first latching element and the at least one second latching element are configured to selectively latch together to retain the plug-in ferrule assembly on the plug-in connector body at either of a first ferrule assembly mounting position and a second ferrule assembly mounting position. Retaining plug-in ferrule assembly on the plug-in connector body at the first ferrule assembly mounting position configures the plug-in connector for mating with a board-mounted connector mounted on the printed circuit board in an inline orientation. Retaining the plug-in ferrule assembly on the plug-in connector body at the second ferrule assembly mounting position configures the plug-in connector for mating with a board-mounted connector on the printed circuit board in a transverse orientation.

Other aspects will be in part apparent and in part pointed out hereinafter.

BRIEF DESCRIPTION OF THE DRAWINGS

FIG. 3 is a perspective of an optical subassembly;

FIG. 4 is an exploded perspective of the optical subassembly;

FIG. 13 is an exploded perspective of the plug-in ferrule assembly of the optical subassembly;

FIG. 14 is another exploded perspective of the plug-in ferrule assembly;

FIG. 15 is a perspective of the plug-in ferrule assembly;

FIG. 16 is a section of the plug-in ferrule assembly taken in the plane including line 16-16 of FIG. 15;

Corresponding parts are given corresponding reference characters throughout the drawings.

DETAILED DESCRIPTION

Figure 1:
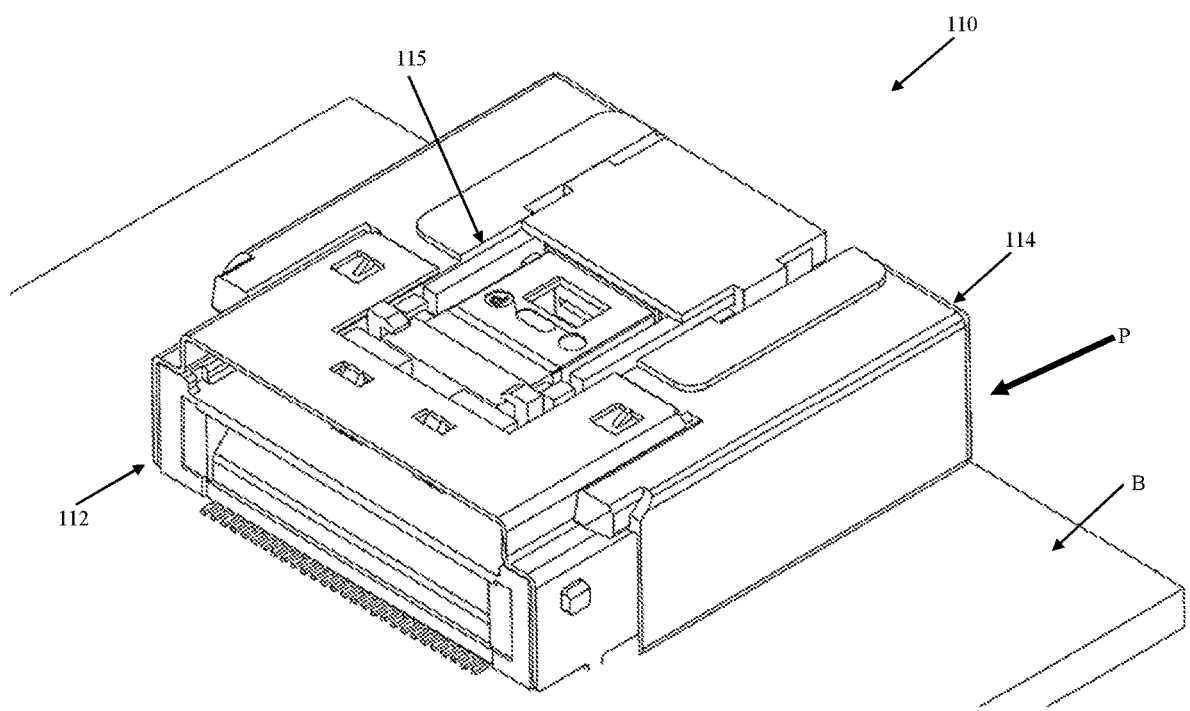
FIG. 1 is a fragmentary perspective of a printed circuit board mounting an optical and electrical connection system in an inline orientation.
Figure 2:
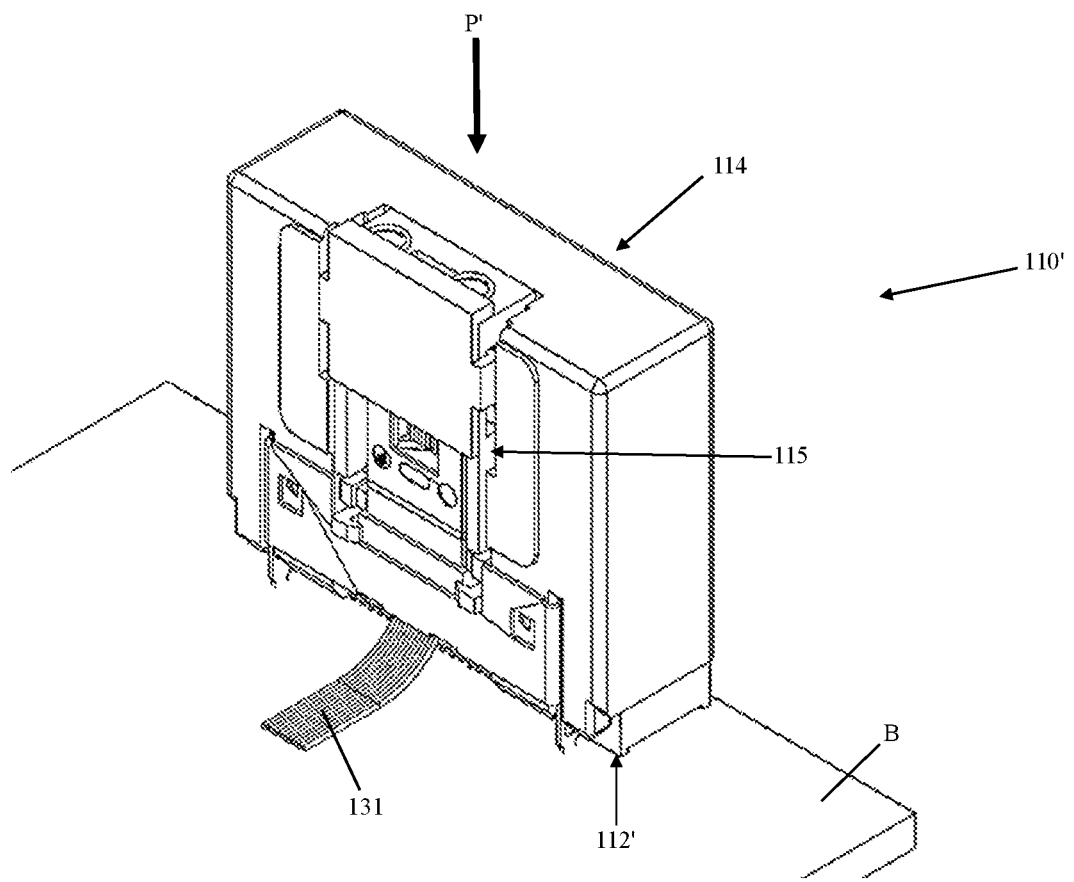
FIG. 2 is a fragmentary perspective similar to FIG. 1, but making an optical and electrical connection to the printed circuit board in a transverse orientation.
Figure 5:
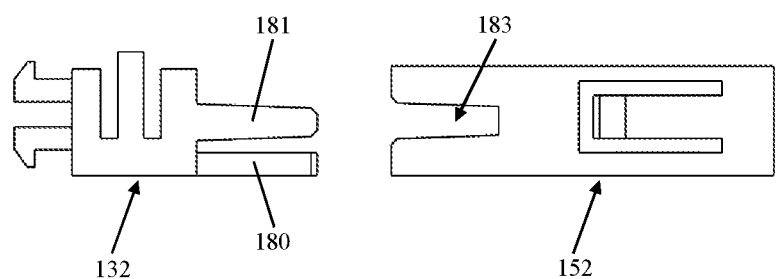
FIG. 5 is an elevation showing a plug-in ferrule holder and a board-mounted ferrule holder of the optical subassembly approaching one another during blind mating.
Figure 6:
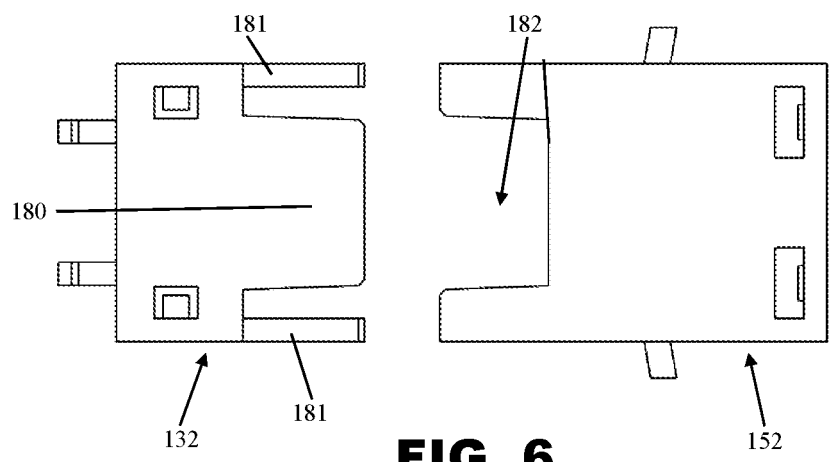
FIG. 6 is a plan view of the plug-in ferrule holder and the board-mounted ferrule holder approaching one another.
Figure 7A:
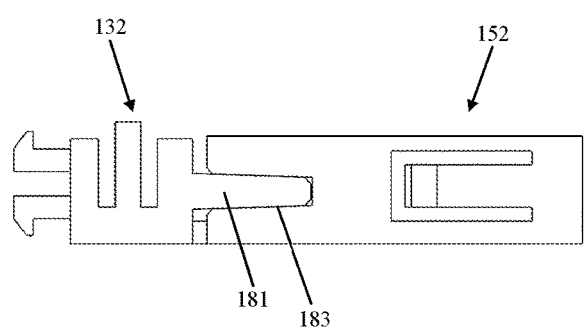
FIG. 7A is an elevation of the plug-in ferrule holder and the board-mounted ferrule holder in mated relationship with one another.
Figure 7B:
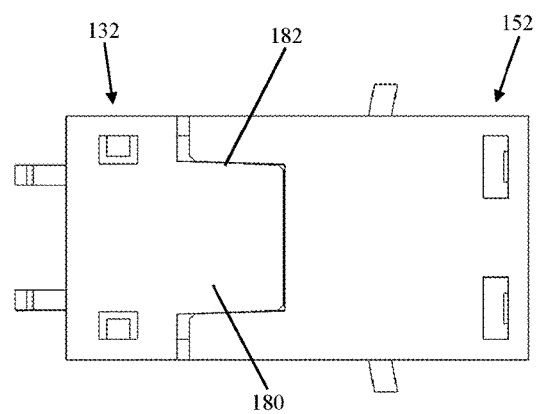
FIG. 7B is a bottom plan view of the plug-in ferrule holder and the board-mounted ferrule holder in mated relationship with one another.

Referring to FIG. 1, an exemplary embodiment of blind mate connection system for making an optical connection and an electrical connection to a printed circuit board B is generally indicated at reference number 110. The connection system 110 generally comprises a board-mounted connector 112 and a plug-in connector 114. In FIG. 1 the connection system 110 has an inline configuration. That is, the plug-in connector 114 plugs into the board-mounted connector 112 by insertion in a plug-in direction P oriented generally parallel to the plane of the board B. Referring to FIG. 2, another exemplary embodiment of a connection system 110' is substantially similar to the connection system 110, except that one component of the board-mounted connector 112' is replaced so that the plug-in connector 114 plugs into the board-mounted connector 112' in a plug-in direction P' oriented transverse (e.g., perpendicular) to the plane of the board B. The configuration of FIG. 1 may be referred to as an 'inline' connection system 110, the configuration of FIG. 2 may be referred to as a 'transverse' or 'perpendicular' connection system 110'. As will be explained more fully below, the plug-in connector 114 comprises the same components in both configurations of the connection system 110, 110', but the arrangement of plug-in connector components differs in the two connection systems. In addition, the same blind mateable optical components can be used in both connection systems 110, 110'.

Referring to FIGS. 3 and 4, the same optical subassembly 115 can be used in both the inline connection system 110 and the transverse connection system 110'. The optical subassembly 115 comprises a board-mounted ferrule assembly 122 and a plug-in ferrule assembly 124. In general, the board-mounted ferrule assembly 122 is configured to selectively attach to the remainder of either of the board-mounted connectors 112, 112', and the plug-in ferrule assembly 124 is configured to attach to the remainder of the plug-in connector at either of a first, inline position for mating with the inline board-mounted connector 112 or a second, transverse position for blind mating with the transverse board-mounted connector 112'.

Figure 8A:
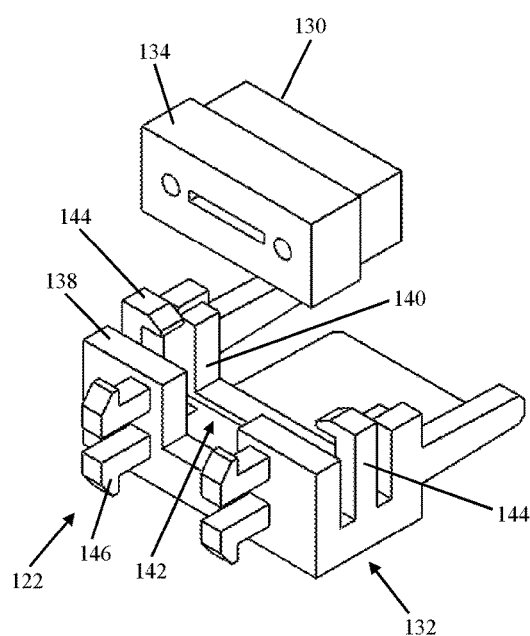
FIG. 8A is an exploded perspective of a board-mounted ferrule assembly of the optical subassembly.
Figure 8B:
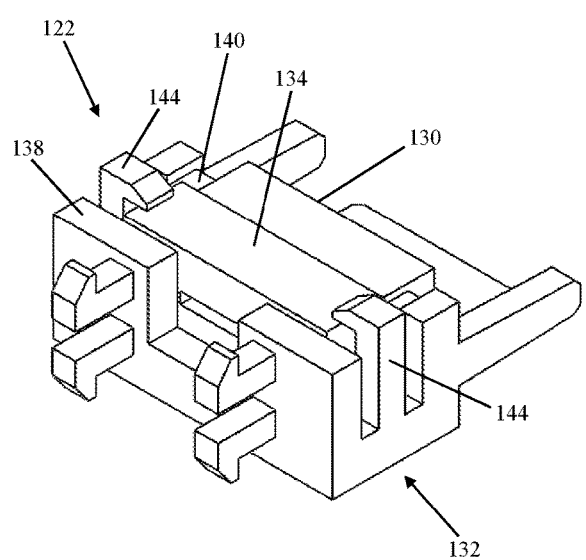
FIG. 8B is a perspective of the board-mounted ferrule assembly.
Figure 8C:
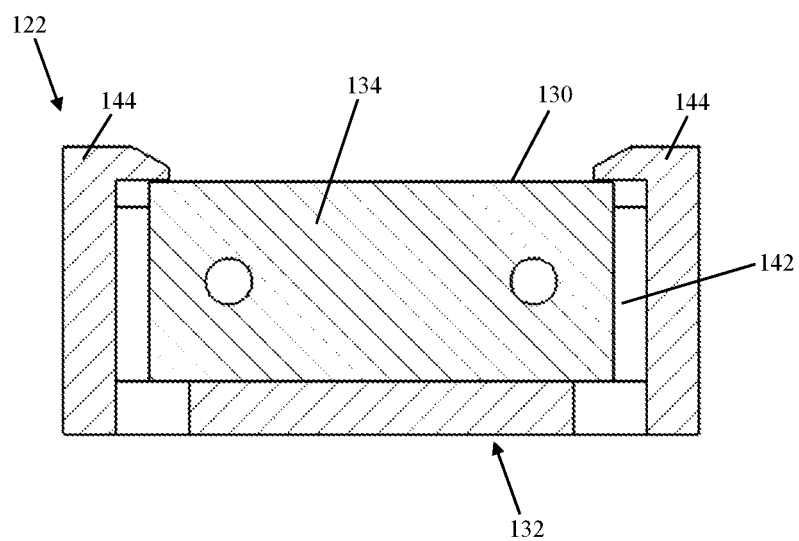
FIG. 8C is a cross section of the board-mounted ferrule assembly.

The board-mounted ferrule sub-assembly 122 comprises a board-mounted ferrule 130 terminating a plurality of board-mounted optical fibers 131 (see FIG. 2) and a board-mounted ferrule holder 132 holding the board-mounted ferrule. In the illustrated embodiment, the board-mounted ferrule 130 comprises a multifiber (MT) ferrule of shorter than usual length. The ferrule 130 comprises a ferrule flange 134 but is devoid of a pin keeper for holding guide pins of the type that configure the ferrule as a male MT ferrule. The ferrule 130 instead comprises guide pin openings 135 that configure the ferrule as a female MT ferrule. The board-mounted ferrule holder 132 comprises a bottom wall 136, a rear wall 138, a front stop 140 longitudinally spaced from the rear wall. A pair of latch arms 144 are arranged at the lateral sides of the rear wall 138 to define a receiving space 142 therebetween. The ferrule 130 is arranged to be received in the receiving space 142. In the illustrative example, the latch arms 144 extend upward from the bottom wall 136 at lateral sides of bottom wall 136. However, the skilled in the art would understand that the latch arms could also extend from the rear wall 138 in an opposite of direction P. In FIGS. 8A-8C, the ferrule flange 134 is configured to be pressed into the receiving space 142 such that the flange is captured between the bottom wall 136 and the latch arms 144. The latch arms each have chamfers forming an inclined plane that facilitate the ferrule 130 pushing the latch arms 144 apart as the ferrule is pushed into the receiving space 142 and hold the ferrule flange 134 such that the movement of the ferrule 130 in the receiving space 142 is prevented. The ferrule flange 134 is rigidly captured in the receiving space 142 by the latch arms 144. Referring again to FIGS. 3 and 4, the board-mounted ferrule assembly 122 is free of any ferrule springs. The board-mounted ferrule holder 132 further comprises a plurality of connector body latch arms 146 (four, as illustrated) configured to latchingly connect the board-mounted ferrule assembly 122 to the remainder of either of the board-mounted connectors 112, 112' as will be described in further detail below.

The plug-in ferrule sub-assembly 124 comprises a plug-in ferrule 150 terminating a plurality of optical fibers (not shown), first and second ferrule springs 151, and a plug-in ferrule holder 152 holding the plug-in ferrule and springs. In the illustrated embodiment, the plug-in ferrule 150 comprises a multifiber (MT) ferrule of standard length. For example, in one or more embodiments, the plug-in ferrule 150 is longer than the board-mounted ferrule 130. The ferrule 150 comprises a ferrule flange 154. The ferrule 150 further comprises a pin holder 155 holding guide pins 155A that configure the ferrule as a male MT ferrule. The plug-in ferrule holder 152 comprises a receptacle 156 defining a space through which the ferrule 150 can be passed into the receptacle. The receptacle further comprises a lid 158 configured to snap onto the receptacle for retaining the ferrule in the receptacle. The receptacle 156 comprises a bottom wall 160 and opposite first and second side walls 162 extending up from the bottom wall. The lid 158 comprises latch hooks 164 extending downward from opposite side edge margins of the lid. As shown in FIGS. 13-16, the latch hooks 164 are configured to latch with the sidewalls 162 to retain the lid 158 on the receptacle 156 over the open top end. The receptacle 156 further comprises a rear wall 166 and front stop 168 longitudinally spaced from the rear wall. A rear lip of the lid 158 opposes the rear wall 166 when the lid is attached to the receptacle 156. The ferrule holder 152 is configured to receive the ferrule 150 and the ferrule springs 151 such that the ferrule springs 151 are compressed between the rear wall 166 and the ferrule 150 and yieldably bias the ferrule forward so that the ferrule flange is pressed against the front stop 168. The opposing sidewalls 162 of the receptacle 156 broadly define a latch element configured to latch the plug-in ferrule assembly 124 in place on the remainder of the plug-in connector assembly 114. In the illustrated embodiment, each sidewall 162 defines a deflectable latch arm 170 with an outwardly projecting latch hook 172. The latch hooks 164 are received in portions of slots that remain upon formation of the latch arms 170.

Referring to FIGS. 5-7B, each of the ferrule holders 132, 152 comprises one or more integral blind mating guides for guiding the ferrule assemblies 130, 150 into optical alignment as the plug-in connector 114 is blind mated with either of the board-mounted connectors 112, 112'. In other words, the ferrule holders 132, 152 comprise complementary blind mating guides for guiding the board-mounted ferrule 130 and the plug-in ferrule 150 into optical alignment as the plug-in connector 114 is blind mated with the board-mounted connector 112, 112'. In the illustrated embodiment, the board-mounted ferrule holder 132 comprises integral, tapered projections 180, 181 and the plug-in ferrule holder comprises integral open-ended, tapered slots 182, 183 configured to slidably accept the integral projections as the plug-in connector 114 is blind mated with the board-mounted connector 112, 112'. More particularly, the bottom wall 136 of the board-mounted ferrule holder 132 comprises a relatively wide projection 180 and the holder 132 defines two relatively narrow projections 181 on opposite sides of the ferrule 130. Likewise, the bottom wall 160 of the plug-in ferrule holder 152 defines a relatively wide slot 182 and each of the opposing sidewalls 162 defines a relatively narrow slot 183. The slots 182, 183 are widest at their open front ends and taper toward the closed rear ends. Conversely, the projections 180, 181 are narrowest at their free leading ends and widest at their opposite trailing ends. This aids in blind mating the optical ferrule assemblies 122, 124 by, during each plug-in motion, allowing for slight misalignment of the ferrule assemblies in the heightwise and widthwise directions when the ferrule assemblies initially come together and then drawing the ferrule assemblies into proper heightwise and widthwise alignment as the leading ends of the projections 180, 181 center themselves in the trailing ends of the slots 182, 183.

Figure 9:
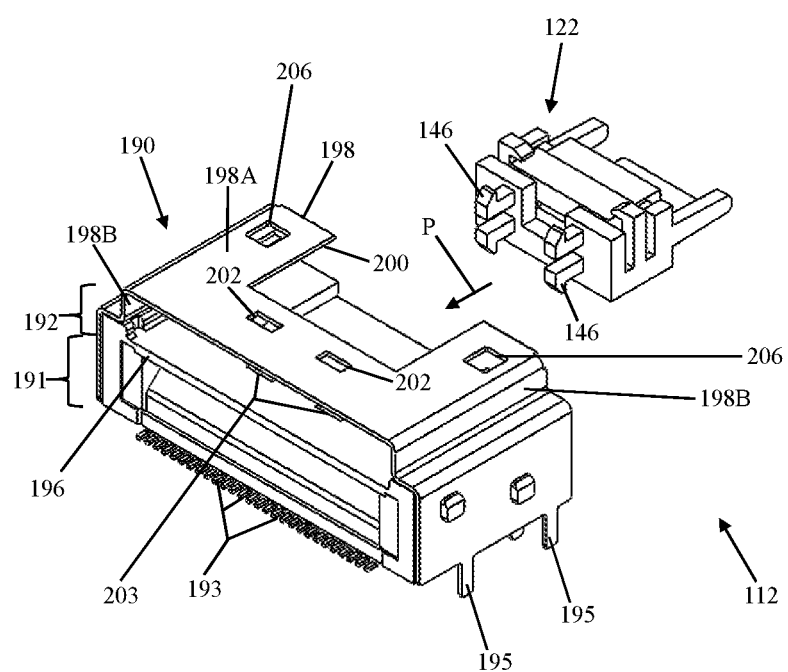
FIG. 9 is an exploded perspective of an inline board-mounted connector including an inline connector body and the board-mounted ferrule assembly.
Figure 10:
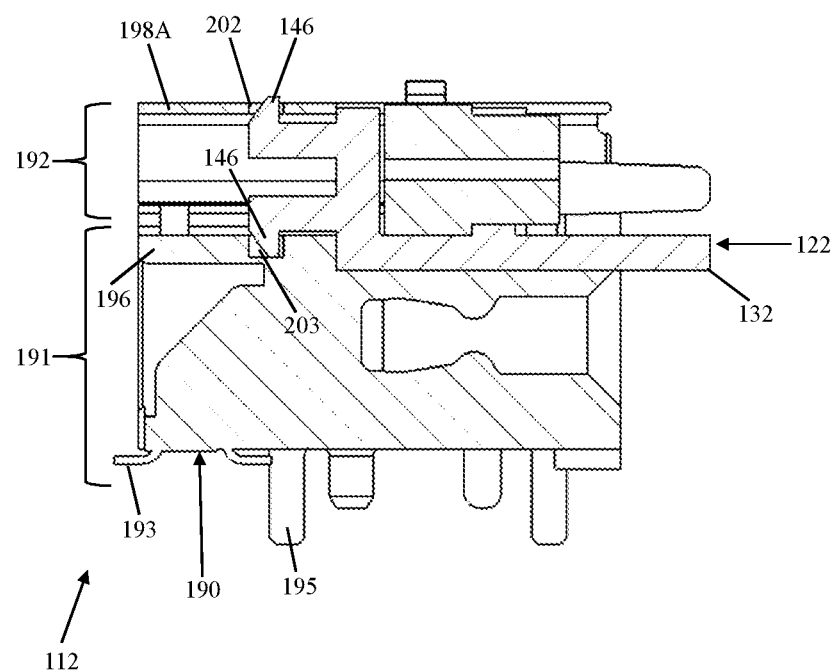
FIG. 10 is a cross section of the inline board-mounted connector.
Figure 11:
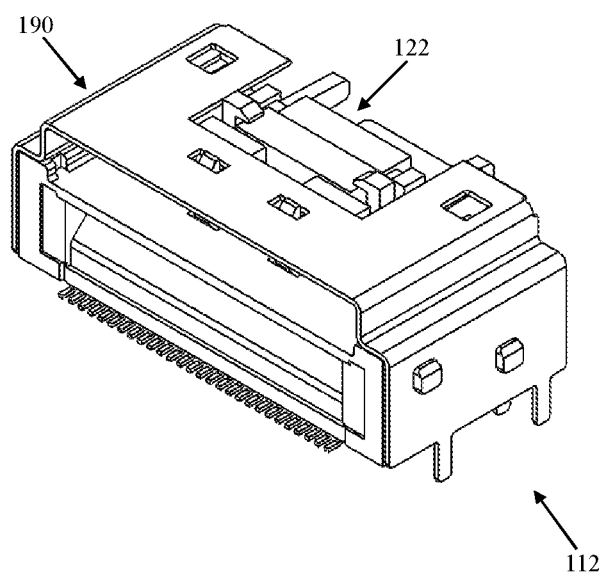
FIG. 11 is a perspective of the inline board-mounted connector.

Referring to FIGS. 9-11, the board-mounted connector 112 comprises a board-mounted connector body 190 configured to mount the board-mounted connector on the printed circuit board B in an inline orientation. The board-mounted connector body 190 comprises a first (lower) electrical connection portion 191 and a second (upper) optical connection portion 192. The electrical connection portion 191 supports a plurality of first electrical contacts 193 and the optical connection portion is configured to support the board-mounted ferrule assembly 122. In the illustrated embodiment, the electrical connection portion 191 and contacts 193 define a female electrical interface configured to make an electrical connection to a male electrical connection interface of the plug-in connector 114 when the plug-in connector is blind mated with the board-mounted connector 112. Board mounting posts 195 protrude downward from the electrical connection portion 191 for mounting the board-mounted connector body 190 on the printed circuit board.

The board-mounted ferrule holder 132 is configured to be secured with the board-mounted connector body 190 to retain the board mounted ferrule assembly 122 on the board-mounted connector body 190. The board-mounted connector body 190 comprises a central wall 196 between the electrical connection portion 191 and the optical connection portion 192. The board-mounted connector body 190 further comprises an outer wall 198 at an outboard end of the optical connection portion 192. The outer wall 198 defines a board-mounted ferrule assembly recess 200 in the optical connection portion 192. The board-mounted connector body 190 is configured to receive the board-mounted ferrule assembly 122 in the board-mounted ferrule assembly recess 200. In the illustrated embodiment, each of the central wall 196 and the outer wall 198 defines a respective pair of latch holes 202, 203. As shown in FIG. 9, the board-mounted ferrule assembly 122 is configured to be inserted into the ferrule assembly recess 200 in the plug-in direction P, whereby the connector body latch arms 146 snap into the latch holes 202, 203 and latch the ferrule assembly in place on the connector body 190.

The outer wall 198 of the connector body 190 comprises an outer section 198A and a pair of blind mating leg sections 198B at lateral sides of the outer section 198A. The outer section 198A includes a pair of connector-to-connector latch holes 206 on opposite sides of the ferrule assembly recess 200. The board-mounted ferrule assembly 122 is configured to attach to the board-mounted connector body 190 between the blind mating leg sections.

Figure 12:
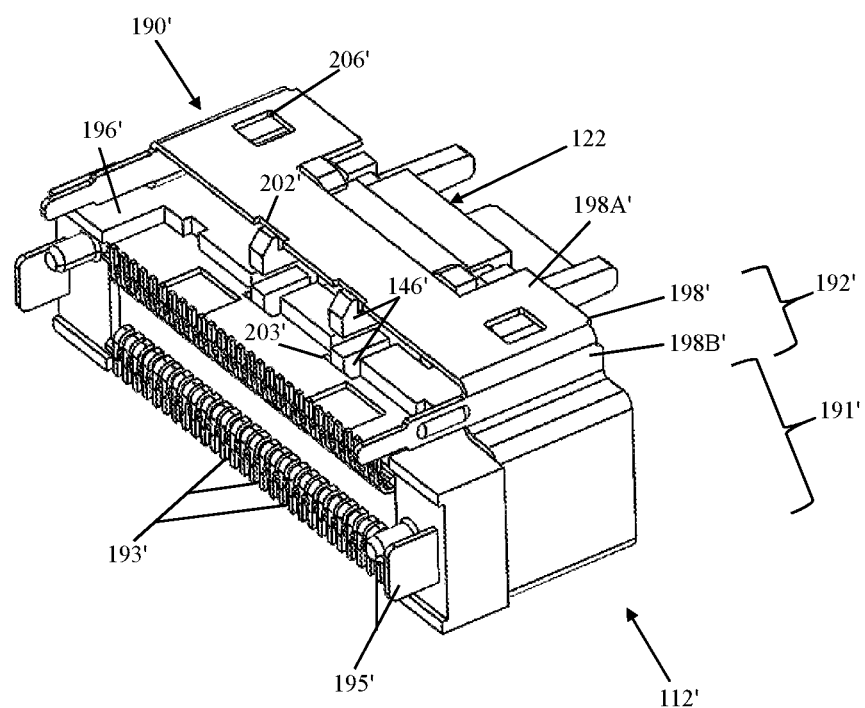
FIG. 12 is a perspective of a transverse board-mounted connector including a transverse connector body and the board-mounted ferrule assembly.

Referring to FIG. 12, the board-mounted connector 112' comprises a board-mounted connector body 190' configured to mount the board-mounted connector on the printed circuit board B in a transverse orientation. The transverse-board mounted connector body 190' is substantially the same as the board-mounted connector body 190, except that it accommodates the electrical contacts 193' in a different orientation, is slightly shorter lengthwise than the connector body 190, and includes mounting posts 195' on the longitudinal end of the connector body so that the board-mounted connector body 190' can be mounted on the printed circuit board B in an upright orientation. Like the board-mounted connector body 190, the board-mounted connector body 190' comprises a first electrical connection portion 191' for holding the electrical contacts 193' to define a mating electrical interface, a second optical connection portion 192' for holding the board-mounted ferrule assembly 122 in a ferrule assembly recess, a central wall 196' between the optical portion and the electrical portion, and an outer wall 198' comprising of an outer section 198A' and two blind mating leg sections 198B'. The outer section 198A' is provided with connector-to-connector latch holes 206'. Each of the central wall 196' and the outer wall 198' defines a pair of latch holes 202',203'. The board-mounted ferrule assembly 122 is configured to be inserted into the ferrule assembly recess 200' in the plug-in direction P', whereby the connector body latch arms 146 snap into the latch holes 202',203' and latch the ferrule assembly in place on the connector body 190'.

Figure 17:
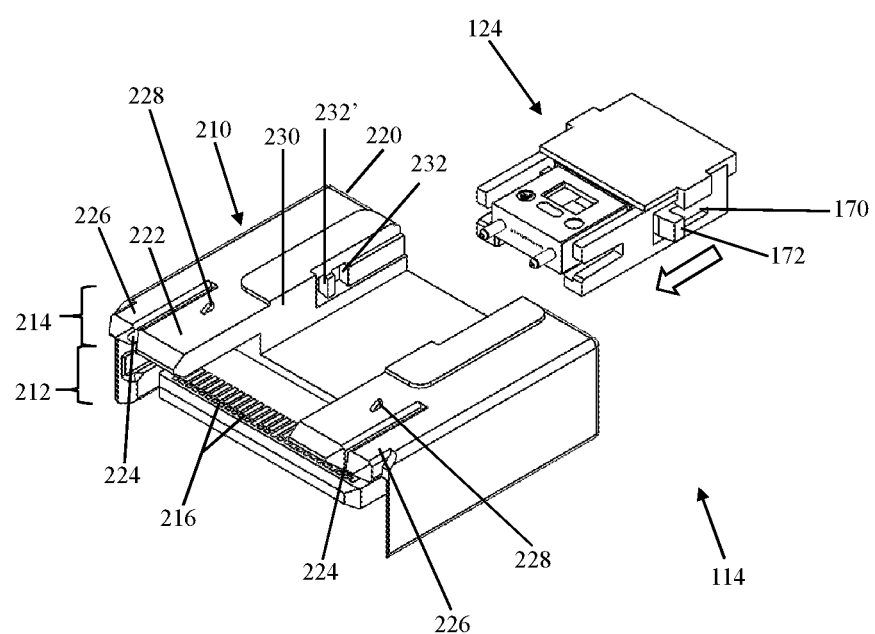
FIG. 17 is an exploded perspective showing the plug-in ferrule assembly being inserted into the plug-in connector body.
Figure 18:
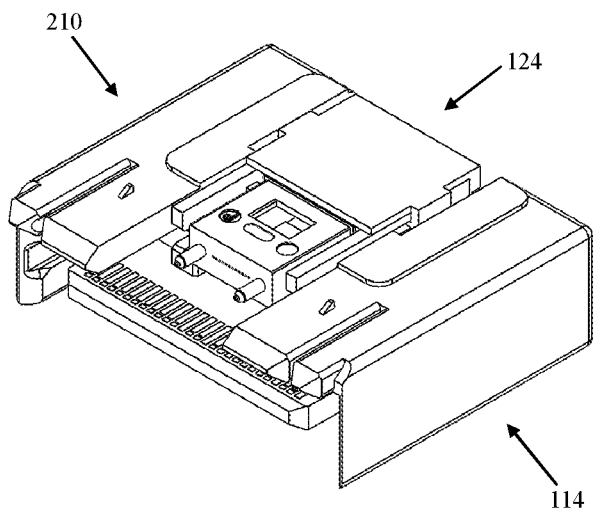
FIG. 18 is a perspective of a plug-in connector.
Figure 19:
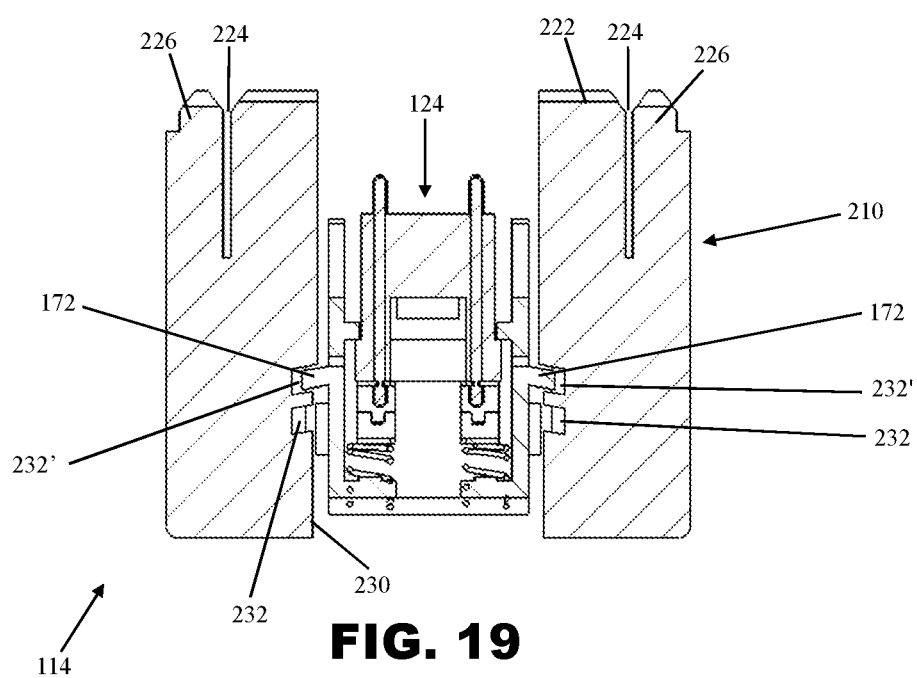
FIG. 19 is a horizontal section of the plug-in connector.

Referring to FIGS. 17-19, the plug-in connector 114 comprises a plug-in connector body 210 including an electrical connection portion 212 and an optical connection portion 214. The electrical connection portion 212 supports a plurality of electrical contacts 216 to define a male electrical connection interface that is configured for mating with the female electrical connection interface of either of the board-mounted connectors 112, 112'.

The plug-in connector body 210 comprises an outer wall 220 including a mating portion 222 and blind mating guide slots 224 on opposite sides of the mating portion. The mating portion 222 is configured to be plugged into the recess 200, 200' of either of the board-mounted connector bodies 190, 190', and the blind mating guide slots 224 are configured to receive the blind mating leg sections 198B, 198B' as the plug-in connector 114 is blind mated with the respective board-mounted connector 112, 112'. In the illustrated embodiment, the leading end sections of the guide slots 224 taper widthwise in the trailing direction to self-center the leg sections 198B, 198B' in the slots when there is a small amount of initial widthwise misalignment during blind mating. In addition, the leading end section of the mating portion 222 tapers to a wedge shape to aid in heightwise alignment during blind mating. In the illustrated embodiment, the outer wall 220 further comprises a pair of outer blind mating finger portions 226 that are configured to be slidably received in recessed corner regions of the outer wall 198, 198' of the respective board-mounted connector body 190, 190' to further aid in blind mating alignment. The outer wall 220 still further comprises a pair of outwardly projecting connector-to-connector latch hooks 228 configured latch with the connector-to-connector recesses 206, 206' of the respective board-mounted connector body 190, 190' when the plug-in connector 114 is plugged into the respective board-mounted connector 112, 112'.

The plug-in connector body 210 comprises a ferrule assembly recess 230 in which to receive the plug-in ferrule assembly 124, and the plug-in connector body further comprises opposing latch recesses 232, 232' on opposite sides of the ferrule assembly recess for latching with the plug-in ferrule assembly 124. In the illustrated embodiment, the plug-in connector body 210 comprises a leading pair of latch recesses 232 for use in configuring the plug-in connector 114 for mating with the inline board-mounted connector 112 and a trailing pair of latch recesses 232' for use in configuring the plug-in connector for mating with the transverse board-mounted connector 112'. As shown in FIG. 17, the plug-in ferrule assembly 124 is configured to be inserted longitudinally into the trailing end of the ferrule assembly recess 230, which causes the latch arms 170 to deflect inward and then secure with plug-in connector body 210. The latch hooks 172 can be selectively snapped into either pair of latch recesses 232, 232' to latch the ferrule assembly 124 in the desired position. Positioning the latch hooks 172 in the trailing first pair of recesses 232 retains the plug-in ferrule assembly 124 on the plug-in connector body 210 at a first ferrule assembly mounting position, which configures the plug-in connector 114 for mating with the longer inline board-mounted connector 112; and positioning the latch hooks 172 in the leading second pair of recesses 232' retains the plug-in ferrule assembly 124 on the plug-in connector body 210 at a second ferrule assembly mounting position, which configures the plug-in connector 114 for mating with the shorter transverse board-mounted connector 112'.

It can be seen that the illustrated connection systems 110, 110' allow for blind mated connections to a printed circuit board B in either an inline orientation or a transverse orientation. Moreover, the connection systems 110, 110' utilize a common optical subassembly 115 and plug-in connector body 210 for both types of connection.

To use the connection system 110 to make an inline connection, the board-mounted connector body 190 is mounted on the printed circuit board B and an electrical connection is made from the board to the electrical contacts 193. The board-mounted ferrule 130 (which is in communication with the printed circuit board via optical fibers 131) is snapped into the ferrule holder 132, and the ferrule assembly 122 is inserted into the ferrule assembly recess 200 in the plug-in direction P to latch the ferrule assembly in place. The plug-in ferrule 150 and ferrule springs 151 are loaded into the receptacle 156 through the open top, as described above, and then the lid 158 is snapped onto the receptacle over the open top to retain the spring-loaded ferrule in the receptacle. The plug-in ferrule 124 is loaded into the ferrule assembly recess 230 in the longitudinal direction (as shown in FIG. 17) until the latch hooks 172 snap into the latch recesses 232. The plug-in connector 114 can be blind mated with the board-mounted connector 112 to make an optical and electrical connection to the printed circuit board. As the plug-in connector 114 is pushed into the board-mounted connector 112, the blind mating legs 198B will pass into the blind mating slots 224 to operatively align the connector bodies 190, 210 for blind mating. Additionally, the blind mating projections 180, 181 enter the blind mating slots 182, 183 to align the optical ferrule assemblies 122, 124 for blind mating. Together, these blind mating features ensure proper alignment of the electrical contacts 193, 216 and optical fiber ferrules 130, 150, enabling the connection system 110 to provide a reliable, inline, blind-mated optical/electrical connection to the printed circuit board B. It will be appreciated that the order of at least some of the steps can be varied.

Using the connection system 110' to make a transverse connection to the printed circuit board B is a similar process. The board-mounted connector body 190' is mounted on the printed circuit board B, and an electrical connection is made to the electrical contacts 193'. The board-mounted ferrule 130 (which is in communication with the printed circuit board via optical fibers 131) is snapped into the ferrule holder 132, and the ferrule assembly 122 is inserted into the ferrule assembly recess 200' in the transverse plug-in direction P' to latch the ferrule assembly in place. The plug-in ferrule 150 and ferrule springs 151 are loaded into the receptacle 156 through the open top, as described above, and then the lid 158 is snapped onto the receptacle over the open top to retain the spring-loaded ferrule in the receptacle. The plug-in ferrule 124 is loaded into the ferrule assembly recess 230 in the longitudinal direction (as shown in FIG. 17) until the latch hooks 172 snap into the latch recesses 232. The plug-in connector 114 can be blind mated with the board-mounted connector 112' to make an optical and electrical connection to the printed circuit board. As the plug-in connector 114 is pushed into the board-mounted connector 112' in transverse direction P', the blind mating legs 198B' pass into the blind mating slots 224 to operatively align the connector bodies 190',210 for blind mating. Additionally, the blind mating projections 180, 181 enter the blind mating slots 182, 183 to align the optical ferrule assemblies 122, 124 for blind mating. Together, these blind mating features ensure proper alignment of the electrical contacts 193',216 and optical fiber ferrules 130, 150, enabling the connection system 110 to provide a reliable, transverse, blind-mated optical/electrical connection to the printed circuit board B. It will be appreciated that the order of at least some of the steps can be varied.

Figure 20:
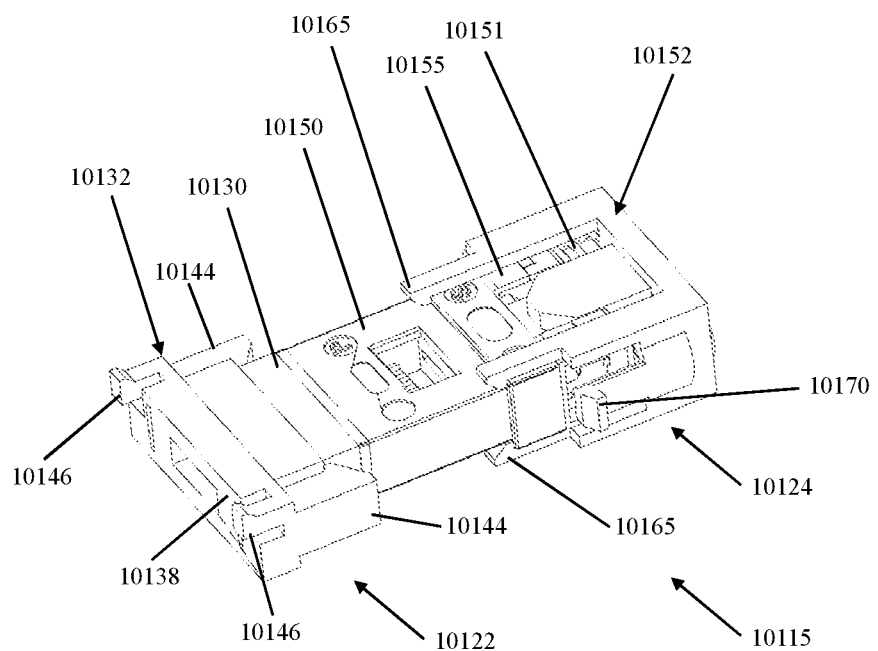
FIG. 20 is a perspective of another embodiment of an optical subassembly usable in a connection system for a printed circuit board in accordance with the present disclosure.

Referring to FIG. 20, in one or more embodiments, the optical subassembly 115 can be replaced with another optical subassembly 10115 of similar construction. The optical sub-assembly 10115 comprises a board-mounted ferrule sub-assembly 10122 and a plug-in ferrule sub-assembly 10124. The board-mounted ferrule sub-assembly 10122 comprises a board-mounted ferrule 10130 of the same type as ferrule 130, and the plug-in ferrule sub-assembly 10124 comprises a plug-in ferrule 10150, ferrule springs 10151, and pin holder 10155 of the same type as corresponding components of the plug-in ferrule subassembly 124. The board-mounted ferrule sub-assembly 10122 comprises a board-mounted ferrule holder 10132 comprising a rear wall 10138, and a pair of latch arms 10144 arranged at the lateral sides of the rear wall to define a receiving space therebetween. The ferrule 10130 can be pushed into the receiving space and held in place between the rear wall 10138 and the latch arms 10144. The board-mounted ferrule holder 10132 further comprises a plurality of connector body latch arms 10146 (two, as illustrated) configured to latchingly connect the board-mounted ferrule assembly 10122 to the remainder of a corresponding board-mounted connector of the general type described above. The plug-in ferrule sub-assembly 10124 comprises a plug-in ferrule holder 10152 defining a receptacle for holding the ferrule 10150. The holder 10152 comprises latch hooks 10165 on the top and bottom sides of the receptacle for retaining the ferrule 10150 in the receptacle such that the ferrule springs 10151 are compressed between the rear wall of the hoder 10152 and the ferrule 10150 and yieldably bias the ferrule forward so that the ferrule flange is pressed against the latch hooks 10165. The opposing sidewalls of the receptacle define deflectable latch arms 10170 (broadly, latch elements) configured to latch the plug-in ferrule assembly 10124 in place on the remainder of a corresponding plug-in connector assembly of the general type described above.

When introducing elements of the present disclosure or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the disclosure are achieved and other advantageous results attained.

As various changes could be made in the above products and methods without departing from the scope of the disclosure, it is intended that all matter contained in the above description shall be interpreted as illustrative and not in a limiting sense.

What is claimed is:

1. A connection system for a printed circuit board, comprising:
   a board-mounted connector comprising a board-mounted connector body configured to mount on the printed circuit board and to hold a plurality of board-mounted optical fibers, the board-mounted optical fibers being operatively connected to the printed circuit board; and
   a plug-in connector configured to blind mate with the board-mounted connector, the plug-in connector comprising a plug-in connector body, the plug-in connector further comprising a plug-in ferrule assembly, the plug-in ferrule assembly comprising a plug-in ferrule and a plug-in ferrule holder holding the plug-in ferrule, the plug-in ferrule holder comprising a latch element for latching with the plug-in connector body to retain the plug-in ferrule assembly on the plug-in connector body such that the system makes an optical connection between the plug-in ferrule and the plurality of board-mounted optical fibers when the plug-in connector is blind-mated with the board-mounted connector,
   wherein the plug-in ferrule holder comprises a bottom wall and opposing sidewalls, wherein each of the bottom wall and the opposing sidewalls defines a respective blind mating guide,
   wherein the latch element comprises a deflectable latch arm with an outwardly projecting latch hook on each of the opposing sidewalls.

2. The system as set forth in claim 1, wherein the plug-in ferrule holder comprises an integral blind mating guide for guiding the plug-in ferrule assembly into optical alignment with the plurality of board-mounted optical fibers as the plug-in connector is blind mated with the board-mounted connector.

3. The system as set forth in claim 1, wherein the plug-in ferrule holder comprises a receptacle with a space to receive the plug-in ferrule.

4. The system as set forth in claim 1, wherein the plug-in ferrule assembly further comprising a ferrule spring, and the plug-in ferrule further comprising a ferrule flange, the plug-in ferrule holder configured to receive the plug-in ferrule and the ferrule spring such that the ferrule spring is compressed between the plug-in ferrule holder and the plug-in ferrule and yieldably biases the plug-in ferrule forward so that the ferrule flange is pressed against the front stop.

5. The system as set forth in claim 1, wherein the plug-in connector body comprises a ferrule assembly recess and opposing latch recesses on opposite sides of the ferrule assembly recess, the outwardly projecting latch hooks being configured to latch with the opposing latch recesses to retain the ferrule assembly in the ferrule assembly recess.

6. The system as set forth in claim 5, wherein the opposing latch recesses are first opposing latch recesses, the plug-in connector body further comprising second opposing latch recesses, the outwardly projecting latch hooks being configured to selectively latch with the first opposing latch recesses and the second opposing latch recesses to selectively configure the plug-in connector in a first plug-in connector configuration and a second plug-in connector configuration, respectively.

7. The system as set forth in claim 1, wherein the board-mounted connector further comprises a board-mounted ferrule assembly comprising a board-mounted ferrule terminating the plurality of board-mounted optical fibers and a board-mounted ferrule holder holding the board-mounted ferrule, the board-mounted ferrule holder configured to latch with the board-mounted connector body to retain the board-mounted ferrule assembly on the board-mounted connector body.

8. The system as set forth in claim 7, wherein the board-mounted ferrule holder and the plug-in ferrule holder comprise complementary blind mating guides for guiding the board-mounted ferrule and the plug-in ferrule into optical alignment as the plug-in connector is blind mated with the board-mounted connector.

9. The system as set forth in claim 7, wherein the board-mounted ferrule holder comprises integral projections and the plug-in ferrule holder comprises integral slots configured to slidably accept the integral projections as the plug-in connector is blind mated with the board-mounted connector.

10. The system as set forth in claim 7, wherein the board-mounted ferrule comprises a board-mounted ferrule flange, the board-mounted ferrule holder comprises latch arms arranged at lateral sides to secure the board-mounted ferrule flange in position.

11. The system as set forth in claim 10, wherein the board-mounted ferrule assembly is free of any ferrule spring.

12. The system as set forth in claim 7, wherein the board-mounted ferrule holder comprises a plurality of connector body latch arms and wherein the board-mounted connector body comprises a plurality of latch holes configured to latch with the plurality of connector body latch arms.

13. The system set forth in claim 1, wherein the board-mounted connector body comprises an electrical connection portion and an optical connection portion, the electrical connection portion supporting a plurality of first electrical contacts and the optical connection portion supporting the board-mounted ferrule assembly.

14. The system as set forth in claim 13, wherein the plug-in connector body comprises an electrical connection portion and an optical connection portion, the electrical connection portion supporting a plurality of second electrical contacts and the optical connection portion supporting the plug-in ferrule assembly.

15. A connection system for a printed circuit board, comprising:
- a board-mounted connector comprising a board-mounted connector body configured to mount on the printed circuit board and to hold a plurality of board-mounted optical fibers, the board-mounted optical fibers being operatively connected to the printed circuit board; and
- a plug-in connector configured to blind mate with the board-mounted connector, the plug-in connector comprising a plug-in connector body, the plug-in connector further comprising a plug-in ferrule assembly, the plug-in ferrule assembly comprising a plug-in ferrule and a plug-in ferrule holder holding the plug-in ferrule, the plug-in ferrule holder comprising a latch element for latching with the plug-in connector body to retain the plug-in ferrule assembly on the plug-in connector body such that the system makes an optical connection between the plug-in ferrule and the plurality of board-mounted optical fibers when the plug-in connector is blind-mated with the board-mounted connector,
- wherein the board-mounted connector comprises a board-mounted ferrule holder holding the plurality of board-mounted optical fibers,
- wherein the board-mounted connector body comprises a first portion and a second portion, a central wall between the first portion and the second portion, an outer wall at an outboard end of the second portion, and a board-mounted ferrule assembly recess in the second portion, the outer wall defining at least one of the plurality of latch holes to latch with the board-mounted ferrule holder and the central wall defining another of the plurality of recesses.

16. The system as set forth in claim 15, wherein each of the board-mounted connector body and the plug-in connector body comprises an electrical connection portion and an optical connection portion.

17. A connection system for a printed circuit board, comprising:
- a board-mounted connector comprising a board-mounted connector body configured to mount on the printed circuit board and to hold a plurality of board-mounted optical fibers, the board-mounted optical fibers being operatively connected to the printed circuit board; and
- a plug-in connector configured to blind mate with the board-mounted connector, the plug-in connector comprising a plug-in connector body, the plug-in connector further comprising a plug-in ferrule assembly, the plug-in ferrule assembly comprising a plug-in ferrule and a plug- in ferrule holder holding the plug-in ferrule, the plug-in ferrule holder comprising a latch element for latching with the plug-in connector body to retain the plug-in ferrule assembly on the plug-in connector body such that the system makes an optical connection between the plug-in ferrule and the plurality of board-mounted optical fibers when the plug-in connector is blind-mated with the board-mounted connector,
- wherein the board-mounted connector body comprises an outer wall defining a recess and blind mating leg sections, and wherein the plug-in connector comprises an outer wall including a mating portion and blind mating guide slots on opposite sides of the mating portion, the mating portion configured to be plugged into the recess and the blind mating guide slots configured to slidably receive the blind mating leg sections as the plug-in connector is blind mated with the board-mounted connector.

18. The system as set forth in claim 17, wherein each of the board-mounted connector body and the plug-in connector body comprises an electrical connection portion and an optical connection portion.

* * * * *